(12) United States Patent
Nolan

(10) Patent No.: US 6,765,941 B2
(45) Date of Patent: Jul. 20, 2004

(54) METHOD AND APPARATUS FOR COOLING A SELF-CONTAINED LASER HEAD

(75) Inventor: John Nolan, Bradford, MA (US)

(73) Assignee: Agfa Corporation, Wilmington, MA (US)

( * ) Notice: Subject to any disclaimer, the term of this patent is extended or adjusted under 35 U.S.C. 154(b) by 238 days.

(21) Appl. No.: 10/008,944

(22) Filed: Dec. 3, 2001

(65) Prior Publication Data

US 2003/0086453 A1 May 8, 2003

(51) Int. Cl.$^7$ .............................................. H01S 3/04
(52) U.S. Cl. ...................................................... 372/35
(58) Field of Search ........................ 372/35, 34, 38.01, 372/72; 257/467; 606/7

(56) References Cited

U.S. PATENT DOCUMENTS

| | | | | |
|---|---|---|---|---|
| 3,393,374 A | * | 7/1968 | Krumboltz .................... 372/16 |
| 3,569,860 A | * | 3/1971 | Booth .......................... 372/67 |
| 3,745,482 A | * | 7/1973 | Patel .......................... 331/94.5 |
| 4,096,450 A | | 6/1978 | Hill et al. |
| 4,163,199 A | * | 7/1979 | Treanor ....................... 372/35 |
| 4,379,203 A | | 4/1983 | Koszytorz |
| 4,586,185 A | * | 4/1986 | DeWilde et al. .............. 372/34 |
| 5,311,528 A | * | 5/1994 | Fujino ......................... 372/35 |
| 5,327,442 A | * | 7/1994 | Yarborough et al. .......... 372/35 |
| 5,331,653 A | * | 7/1994 | Kojima et al. ................. 372/35 |
| 5,375,518 A | * | 12/1994 | Kurz ........................... 101/216 |
| 5,422,899 A | * | 6/1995 | Freiberg et al. ............... 372/25 |
| 5,465,661 A | * | 11/1995 | White .......................... 101/219 |
| 5,572,538 A | * | 11/1996 | Saitoh et al. ................. 372/34 |
| 5,748,656 A | * | 5/1998 | Watson et al. ................ 372/35 |
| 5,749,295 A | * | 5/1998 | Kurz ........................ 101/350.1 |
| 5,781,574 A | | 7/1998 | Connors et al. |
| 5,806,950 A | * | 9/1998 | Gale et al. .................... 353/78 |
| 5,848,081 A | * | 12/1998 | Reed et al. .................... 372/35 |
| 5,940,420 A | * | 8/1999 | Blair et al. .................... 372/35 |
| 6,007,205 A | * | 12/1999 | Fujimori ....................... 353/57 |
| 6,043,456 A | * | 3/2000 | Meyer et al. ................. 219/216 |
| 6,058,718 A | * | 5/2000 | Forsberg et al. .............. 62/125 |
| 6,115,396 A | * | 9/2000 | Connors ....................... 372/30 |
| 6,266,352 B1 | * | 7/2001 | Eguchi et al. ................. 372/35 |
| 6,552,355 B1 | * | 4/2003 | Green ........................ 250/573 |
| 6,570,900 B2 | * | 5/2003 | Furumoto et al. ............. 372/54 |

* cited by examiner

Primary Examiner—Don Wong
Assistant Examiner—Tuan N. Nguyen
(74) Attorney, Agent, or Firm—Grant Houston; Robert A. Sabourin; Joseph D. King

(57) ABSTRACT

A cooling system having a single circulator cools a laser, laser power supply, and laser light valve using two parallel cooling loops having different flow rates. Independent protection against an over temperature condition of the laser, laser power supply, and/or laser light valve is provided in each cooling loop.

26 Claims, 1 Drawing Sheet

METHOD AND APPARATUS FOR COOLING A SELF-CONTAINED LASER HEAD

BACKGROUND OF THE INVENTION

The invention generally relates to the field of laser imaging printing plates on a platesetter or imaging film on an imagesetter.

The process of transferring text and/or graphic information from electronic form to visual form on an imagable medium is called imaging. The information can be transferred to an imagable media using light such as produced by a laser beam or beams. The imagable media may be a printing plate or film that is sensitive to the wavelength, and/or thermal characteristics of the laser beam(s) used to accomplish imaging.

Some printing plates are imaged using an ablative process where an outer emulsion layer of the plate is removed using a laser beam having very high optical power. Other types of printing plates are thermally sensitive wherein an outer emulsion layer is not removed but is simply exposed to the laser beam also requiring a significantly high power laser beam.

Lasers are known low efficiency devices that require a large amount of input electrical power in order to provide modest levels of output optical power. The difference between the amount of electrical power provided to the laser and the output optical power generated by the laser is dissipated as heat. Proper operation of the laser requires removing the excess heat produced by the laser. Failure to remove excess heat from the laser can lead to the laser not meeting performance specifications. Consequently, an imageable media will not be properly exposed yielding a defective product wherein the image is not completely transferred to the plate, or the image is distorted. Even worse, failure to remove the excess heat from the laser can result in premature failure of the laser as is well known in the industry. Consequently, adequate means must be provided to remove excess heat from the laser.

Other components of a laser imaging system such as a laser power supply and laser light valve also require cooling. The laser power supply is used to provide electrical power to the laser. The power supply is also not 100 percent efficient resulting in significant heat being generated within the power supply that must be removed.

The laser light valve is used to produce a plurality of individually controllable laser light beams. Two types of laser light valves are the Grating Light Valve (GLV) produced by Silicon Light Machines, and the DMD micromirror light valve by Texas Instruments. Light valves are often supplied with the high optical power from laser sources. Since light valves must handle high power laser beams and also have losses, some of the input optic power supplied by the laser is lost as heat and must be removed from the light valve in order to function properly.

Various components of a laser imaging system present different thermal loads necessitating different degrees of cooling.

Some workers have simply employed separate, dedicated cooling systems for each laser component, each cooling system having unique cooling capabilities.

U.S. Pat. No. 3,569,860 to Booth, and U.S. Pat. No. 5,327,442 to Yarborough et al both teach such a design. Both Booth and Yarborough use separate cooling systems to cool a laser gain medium such as a rod(s), and a flash lamp(s) for pumping the rod(s). This approach, though technically adequate for cooling purposes, is expensive, complex, and requires a large floor space. Further, multiple, separate cooling systems are too bulky to include in an imagesetter or platesetter.

U.S. Pat. No. 5,781,574 to Connors et al teaches a method of cooling a plurality of lasers using a heat exchanger. The system taught by the '574 patent is effective because Connors teaches using four individual lasers that are pulsed on and off at a low duty cycle and "adding" the output beams together into a single beam. This prevents generation of large amounts of heat at a significant increase in cost, complexity, and shear volume of parts. With such little heat generated in this manner, a simple heat exchanger may be employed as taught by Connors to cool the plurality of lasers.

Other attempts to cool multiple laser components (e.g. laser rod, and/or laser flash lamp) presenting different thermal loads, use a single cooling system, but require insulating a laser component from the coolant as described in U.S. Pat. No. 5,848,081 to Reed et al. This technique applies a portion of the cooling capacity of a cooling system to an insulated laser rod, while allowing for the application of the remaining cooling capacity to an uninsulated flash lamp.

A similar method taught by Hill et al in U.S. Pat. No. 4,096,450 uses two separate cooling systems where one cooling system cools a flashlamp via conduction by surrounding a portion of the lamp with barium sulfate powder. The other system cools a laser rod by circulating coolant around the rod.

SUMMARY OF THE INVENTION

Problems described in the prior art supra, and others, are solved by applicant's invention of providing a single cooling system capable of cooling not only a laser and the laser components, but the system level components in the laser imaging system including the laser power supply and laser light valve. Further, the cooling system is capable of cooling components of a laser imaging system that present different thermal loads to the cooling system.

An object of the invention herein is to provide a single cooling system capable of cooling a laser, a laser power supply, and a laser light valve simultaneously.

A further object of the invention herein is to provide a single cooling system capable of cooling multiple thermal loads requiring different degrees of cooling.

A further object of the invention herein is to provide a single cooling system that precludes premature laser failure due to overheating of the laser.

Another object of the invention is to provide thermal protection for a laser in the event a coolant flow problem arises in any portion of the cooling system.

BRIEF DESCRIPTION OF THE DRAWING

The following description may be further understood with reference to the accompanying drawing in which.

Figure 1:
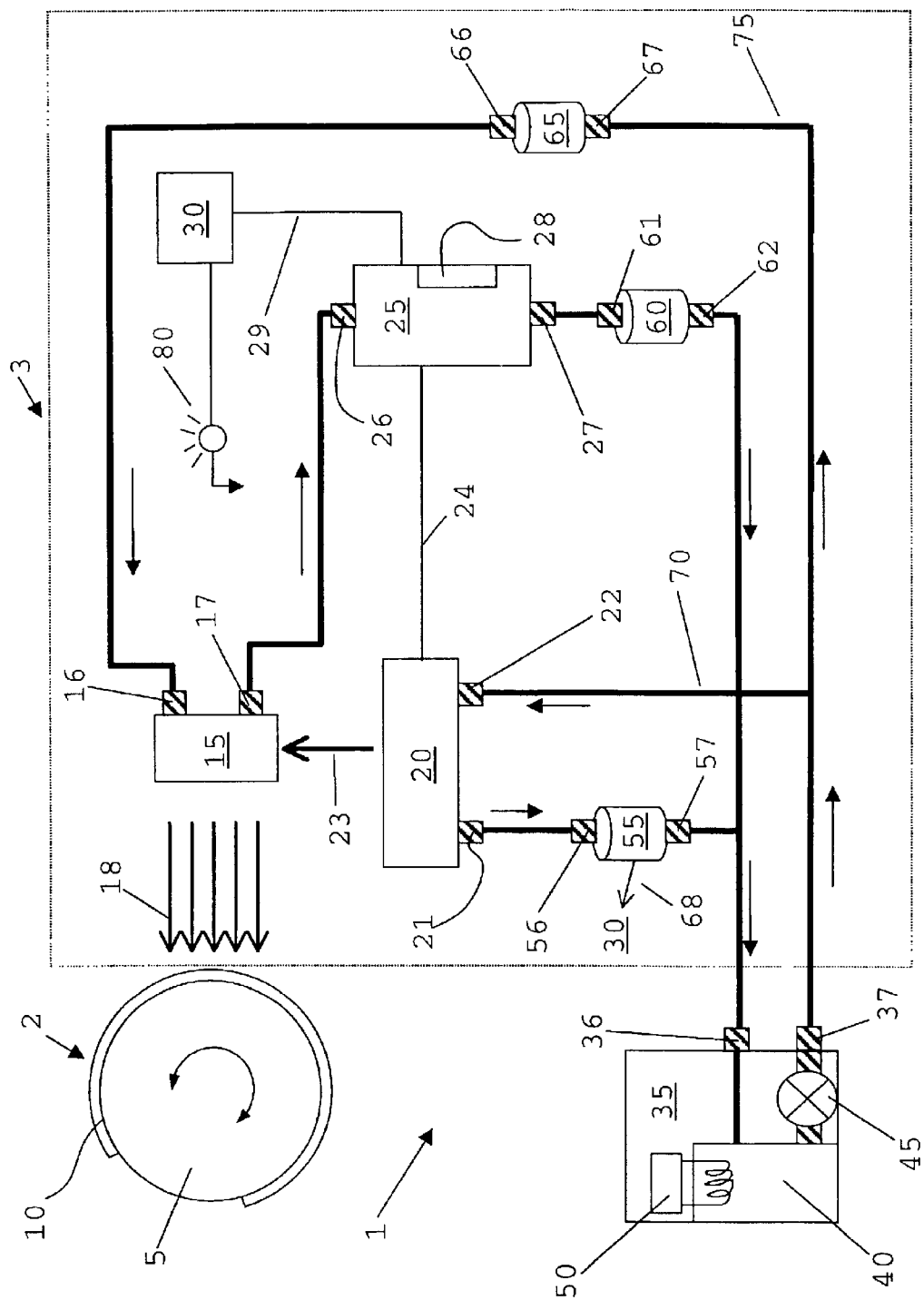
FIG. 1 is a diagram showing operation of the invention herein as deployed with an external drum imaging system.

The drawing is shown for illustrative purposes only, and is not to scale.

DETAILED DESCRIPTION OF THE INVENTION

A cooling system for a self-contained, moveable, laser imaging head 3 in accordance with the invention herein is generally shown in FIG. 1. The inventive cooling system 1 is shown as part of a laser system, which in this particular example, is deployed with an imaging system 2 such as a platesetter, for imaging a printing plate 10.

Imaging system 2 is of the external drum type in which an imageble printing plate 10 is supported on the outside surface of a rotatable drum 5 and imaged using a moveable laser imaging system. Laser imaging head 3 scans a laser beam or beams across plate 10 to record an image onto plate 10. However, the invention is not limited to machines of the external drum type, and may be used with machines employing internal drum configurations (not shown) and/or with flatbed imagers (not shown) in addition to capstan or virtual drum machines.

Laser power supply 25 provides electrical power to laser 20. Laser 20 produces a high power laser beam 23 which is directed to light valve 15. Light valve 15 produces a plurality of individual laser beams 18 from laser beam 23. Each one of the plurality of laser beams 18 is individually controllable by light valve 15 and may be separately pulsed on and off as desired. Light valve 15 may be of the GLV or DMD variety as described supra, or may be any other type of light valve (including TIR) that produces a plurality of laser beams 18 from laser beam 23, and further provides modulation capability for each one of laser beams 18.

Laser 20 may be of the semiconductor type that employs multiple emitters to produce a single high power laser beam 23 though it is not limited to being a semiconductor laser. Solid state lasers such as Nd:YAG, gas lasers or even dye lasers may be used in lieu of laser 20. The main difference being the required coolant flow for each type of laser is different. Laser 20 is cooled by circulating a cooling fluid through small cooling channels formed into a cooling block (not shown) that is part of laser 20.

A single circulating unit 35 has a tank 40 containing a cooling fluid (alternatively referred to as coolant) which is preferably de-ionized water. The cooling fluid (not shown) is cooled by a refrigeration unit 50. The coolant is circulated through laser 20, laser power supply 25, light valve 15 and back into tank 40 using circulating pump 45. Circulating unit 35 may be stationary and separate from the laser head 3.

Laser 20 and laser power supply 25 require different rates of flow of cooling fluid through each component. Laser 20 requires a flow rate as low as about 0.13 gallons per minute (GPM) depending on the type of laser. Laser power supply 25 requires a higher flow rate of about 0.5 GPM.

The invention herein provides two parallel coolant supply paths to the laser 20 and laser power supply 25, each coolant supply path having a different flow rate.

First parallel coolant supply path 70 is connected between coolant supply port 37 located on circulating unit 35, and coolant inlet port 22 of laser 20. Coolant outlet port 21 of laser 20 is serially connected to flow rate sensor 55 via inlet port 56. Outlet port 57 of flow rate sensor 55 is connected to a coolant return port 36 of circulating unit 35 wherein the coolant is returned to the tank 40. Since no flow restriction devices or other flow control means are deposed in the laser cooling loop, the flow rate is determined by the size and number of the cooling channels within laser 20. Flow rate sensor 55, which may be a digital or analog sensor, or alternatively, a simple flow switch, provides a signal to controller (or microprocessor) 30 representative of a coolant flow rate through laser 20 via connection 68.

Low coolant flow within laser 20 is a known failure mode and often occurs as a result of debris or organic growth within the small channels formed into the cooling block integral to laser 20 (not shown). Flow rate sensor 55 is deployed in the manner described in order to detect such a condition.

If the rate of flow of cooling fluid through laser 20, as detected by flow rate sensor 55, falls below a predetermined value, controller 30 sends a signal to power supply 25 via interface 29, causing power supply 25 to remove electrical power from laser 20 via connection 24. Alternatively, or in addition to shutting down laser 20, controller 30 may alert an operator via a visual or audio alert means 80 such as a light, computer graphic, buzzer, bell etc.

Second parallel coolant supply path 75 is connected between coolant supply port 37 located on circulating unit 35, and coolant inlet port 67 of flow control valve 65. Flow control valve 65, such as a type manufactured by Dole, Part Number 1407096, is preset to a predetermined flow rate, is self regulating and provides a constant rate of flow of coolant to light valve 15, and power supply 25 independent of pressure.

Coolant outlet port 66 of flow control valve 65 is serially connected to coolant inlet port 16 of light valve 15. Coolant outlet port 17 of light valve 15 is serially connected to coolant inlet port 26 of laser power supply 25. Coolant outlet port 27 of laser power supply 25 is serially connected to on/off valve 60 via coolant inlet port 61. Outlet port 62 of on/off valve 60 is connected to coolant return port 36 of circulating unit 35 wherein the coolant is returned to the tank 40.

On/off valve 60 provides the ability to shut off the supply of coolant to second parallel coolant supply path 75. This allows for purging of the cooling system 1.

Laser power supply 25 has temperature monitoring circuitry 28 for measuring the temperature of laser power supply 25. If temperature monitoring circuitry 28 measures a temperature that exceeds a predetermined value, temperature monitoring circuitry 28 causes power supply 25 to remove electrical power from laser 20 via connection 24.

The combination of a) temperature monitoring circuitry 28 coupled to laser power supply 25 and b) flow rate sensor 55 together with controller 30, provide laser 20 with complete protection against overheating due to low coolant flow. Protection against low coolant flow related failures is independently provided in each parallel supply branch, 70 & 75, of cooling system 1.

For example, if a blockage occurs at coolant outlet port 27 of laser power supply 25, the temperature of laser power supply 25 begins to increase. Temperature monitoring circuitry 28 detects the increase in temperature and removes electrical power from laser 20 via connection 24 when the temperature of laser power supply 25 exceeds a predetermined limit. Further, laser power supply 25 may shut itself down after removing power from laser 20. A blockage occurring anywhere in second parallel coolant supply path 75 is addressed in the same manner.

Similarly, a blockage occurring anywhere in first parallel coolant supply path 70 is detected and addressed by flow rate sensor 55 and controller 30 as described supra.

Though the invention herein is described with reference to imaging machines in the graphic arts industry, the invention is not restricted to use in the graphics industry and may be used wherever a laser system requires cooling.

Those skilled in the art will appreciate that numerous modifications and variations may be made to the above disclosed embodiments without departing from the spirit and scope of the present invention.

I claim:

1. A cooling apparatus for a laser system comprising:
a single circulating unit having a tank for holding a supply of cooling fluid, and a pumping device operative for circulating said cooling fluid through a laser source, a laser power supply, a light valve and back into the circulating unit;
wherein a flow of said cooling fluid is divided into first and second parallel supply branches, said laser source connected in series with said first supply branch, and wherein said light valve and said laser power supply are connected in series with said second supply branch; and
wherein the flow of said cooling fluid in said second parallel supply branch passes through the laser power supply after the flow of said cooling fluid has passed through said light valve.

2. The cooling apparatus of claim 1 wherein said circulating unit further includes a refrigeration unit operative to cool said cooling fluid below normal room temperature.

3. The cooling apparatus of claim 1 further comprising a flow rate sensor connected in series to a coolant outlet port of said laser source, said flow rate sensor operative to provide a signal to a controller, said signal representative of a flow rate of cooling fluid passing through said laser source.

4. The cooling apparatus of claim 3 wherein said controller shuts down said power supply when said signal falls below a predetermined value indicating said flow rate of cooling fluid has decreased below a desired flow rate.

5. The cooling apparatus of claim 1 further comprising a flow control valve connected in series to a coolant inlet portion of said light valve, said flow control valve operable to maintain a constant flow rate of said cooling fluid through said second parallel branch.

6. The cooling apparatus of claim 5 wherein a first flow rate of said cooling fluid in said first parallel branch is about 0.13 gallon per minute and a second flow rate of said cooling fluid in said second parallel branch is about 0.5 gallon per minute.

7. The cooling apparatus of claim 1 wherein said power supply contains thermal monitoring and shutdown apparatus.

8. The cooling apparatus of claim 1 wherein a shut off valve is serially connected between a coolant outlet port of said laser power supply and a coolant return port of said circulating unit, said valve operative to reversibly interrupt said flow of said cooling fluid.

9. A cooling apparatus for a laser system comprising:
a single circulating unit having a tank for holding a supply of cooling fluid, and a pumping device operative for circulating said cooling fluid through a laser, a flow rate sensor, a flow control valve, a laser light valve, a laser power supply, and back into the circulating unit;
a first supply branch connected to a coolant supply port deposed on said circulating unit, said first supply branch providing a first flow of cooling fluid at a first flow rate, to a first coolant inlet port of a laser, said first flow of cooling fluid exiting a first coolant outlet port of said laser after passing through a portion of said laser, said first flow of cooling fluid then passing through a flow rate sensor serially connected to said first outlet port of said laser, said first flow of cooling fluid then returning back to said circulating unit; and
a second supply branch connected to said coolant supply port deposed on said circulating unit in parallel to said first supply branch, said second supply branch providing a second flow of cooling fluid at a second flow rate different than said first flow rate, first to said flow control valve, then to said laser light valve serially connected to said flow control valve, and lastly to said laser power supply serially connected to said laser light valve, said second flow of cooling fluid then returning back to said circulating unit.

10. The cooling apparatus of claim 9 wherein said circulating unit further includes a refrigeration unit operative to cool said cooling fluid below normal room temperature.

11. The cooling apparatus of claim 9 wherein said flow rate sensor is operative to provide a signal to a controller, said signal representative of a flow rate of cooling fluid passing through said laser.

12. The cooling apparatus of claim 11 wherein said controller shuts down said laser power supply when said signal falls below a predetermined value indicating said flow rate of cooling fluid has decreased below a desired flow rate.

13. The cooling apparatus of claim 9 further wherein said flow control valve is operable to maintain a constant flow rate of said cooling fluid through said second parallel branch.

14. The cooling apparatus of claim 9 wherein said first flow rate of said cooling fluid in said first parallel branch is about 0.13 gallon per minute and said second flow rate of said cooling fluid in said second parallel branch is about 0.5 gallon per minute.

15. The cooling apparatus of claim 9 wherein said laser power supply further includes thermal monitoring and shutdown apparatus.

16. The cooling apparatus of claim 9 wherein a valve is serially connected between a coolant outlet port of said laser power supply and a coolant return port of said circulating unit, said valve operative to reversibly interrupt said flow of said cooling fluid.

17. A cooling apparatus for a laser system comprising:
a laser source for producing a laser beam;
a laser power supply operative to provide electrical power to said laser source;
a light valve for producing a plurality of individual light beams from said laser beam and for independently modulating each of said plurality of light beams;
a single refrigeration unit having a tank for holding a supply of cooling fluid, and a pumping device operative for circulating said cooling fluid through said laser source, said laser power supply, said light valve and back into the refrigeration unit;
wherein a flow of said cooling fluid is divided into first and second parallel supply branches, said laser source connected in series with said first branch, and wherein said light valve and said laser power supply are connected in series with said second branch; and
wherein the flow of said cooling fluid in said second parallel branch passes through the laser power supply after the flow of said cooling fluid has passed through said light valve.

18. The cooling apparatus of claim 17 further comprising a flow rate sensor connected in series to a coolant return portion of said laser source, said flow rate sensor operative to provide a signal to a controller, said signal representative of a flow rate of cooling fluid passing through said laser source.

19. The cooling apparatus of claim 17 wherein said controller shuts down said laser power supply when said signal falls below a predetermined value indicating said flow rate of cooling fluid has decreased below a desired flow rate.

20. The cooling apparatus of claim 17 further comprising a flow control valve connected in series to a coolant inlet portion of said light valve, said flow control valve operable to maintain a constant flow rate of said cooling fluid through said second parallel branch.

21. The cooling apparatus of claim 17 wherein a first flow rate of said cooling fluid in said first parallel branch is about 0.13 gallon per minute and a second flow rate of said cooling fluid in said second parallel branch is about 0.5 gallon per minute.

22. The cooling apparatus of claim 17 wherein said laser power supply contains thermal monitoring and shutdown apparatus.

23. The cooling apparatus of claim 17 wherein a valve is serially connected between said laser power supply and said circulating unit, said valve operative to reversibly interrupt said flow of said cooling fluid.

24. A method of cooling a laser system, said laser system comprising a laser source, a laser light valve and a laser power supply, the method comprising the steps of:

providing a single circulating unit having a tank for holding a supply of cooling fluid, and a pumping device operative for circulating said cooling fluid through said laser source, a flow rate sensor, a flow control valve, said laser light valve, said laser power supply, and back into the circulating unit;

providing a first parallel flow path by serially connecting said laser source and said flow rate sensor together, and connecting a coolant inlet port deposed on said laser source to a coolant supply port of said circulating unit, and further connecting a coolant outlet port of said flow rate sensor to a coolant return port deposed on said circulating unit;

providing a second parallel flow path by connecting said coolant supply port of said circulating unit to a first port of said flow control valve, and serially connecting a second port of said flow control valve to a first port of said laser light valve, and serially connecting a second port of said laser light valve to a coolant input port of said laser power supply, and then connecting a coolant outlet port of said laser power supply to said coolant return port deposed on said circulating unit;

establishing flow of cooling fluid through each of first and second parallel flow paths wherein a first flow rate of cooling fluid through said first parallel path is different than a second flow rate of cooling fluid through said second parallel path;

wherein said first rate of cooling fluid flow is determined by a size and number of cooling channels formed in a portion of said laser; and wherein said second rate of cooling fluid flow is controlled by said flow control valve, said flow control valve further operative to maintain said second rate of cooling fluid flow constant.

25. The method of cooling a laser system of claim 24 wherein said circulating unit further includes the step of cooling said cooling fluid below normal room temperature prior to circulating said fluid into said first and said second parallel flow paths.

26. The method of cooling a laser system of claim 24 further including the step of disabling said laser power supply in response to an error signal exceeding a predetermined value, said error signal generated by said flow rate sensor, said error signal monitored by a controller.

* * * * *